United States Patent [19]

Stoneham et al.

[11] Patent Number: 4,788,156

[45] Date of Patent: Nov. 29, 1988

[54] SUBCHANNEL DOPING TO REDUCE SHORT-GATE EFFECTS IN FIELD EFFECT TRANSISTORS

[75] Inventors: Edward B. Stoneham, Los Altos; Masahiro Omori, Palo Alto; Arthur D. Herbig, San Jose, all of Calif.

[73] Assignee: Microwave Technology, Inc., Fremont, Calif.

[21] Appl. No.: 911,270

[22] Filed: Sep. 24, 1986

[51] Int. Cl.4 .................. H01L 21/265; H01L 21/324
[52] U.S. Cl. .................... 437/022; 357/23.3; 357/24; 357/91; 437/29; 437/912
[58] Field of Search .......... 437/22, 29, 912; 357/91, 24, 23.3

[56] References Cited

U.S. PATENT DOCUMENTS

| 4,377,030 | 3/1983 | Pettenpaul et al. | 437/22 |
| 4,422,087 | 12/1983 | Ronen | 357/15 |
| 4,503,599 | 3/1985 | Ueyanagi et al. | 437/22 |
| 4,642,879 | 2/1987 | Kawata et al. | 148/DIG. 84 |

FOREIGN PATENT DOCUMENTS 0143075 11/1979 Japan .

OTHER PUBLICATIONS

Takada et al., "A 2 Gb/s Throughput GaAs Digital Time Switch LSI Using LSCFL", IEEE 1985 Microwave and Millimeter Wave Monolithic Circuit Symposium at St. Louis, MO, pgs. 22-26.

Yamasaki et al., "Below 10 ps/Gate Operation With Buried p-Layer SAINT FETS", published in Electronics Letters on Dec. 6, 1984, pp. 1029-1031.

Primary Examiner—Upendra Roy, III
Attorney, Agent, or Firm—Kenneth E. Leeds; Alan H. MacPherson; Paul J. Winters

[57] ABSTRACT

One embodiment of a process in accordance with our invention includes the step of forming a P type region on a semiconductor substrate. After the P type region is formed, an N type layer is epitaxially grown on the P type region. A Schottky gate is then formed on the N type epitaxial layer. A first portion of the epitaxial layer serves as a transistor source, a second portion of the epitaxial layer serves as the transistor drain, and a third portion of the epitaxial layer serves as the channel. Of importance, the P type semiconductor region helps prevent various short channel effects caused when current carriers flowing between the source and drain flow too far from the Schottky gate.

12 Claims, 4 Drawing Sheets

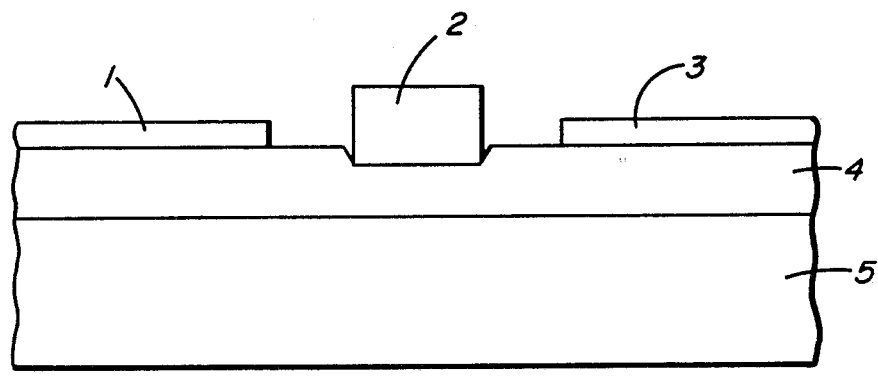
FIG._1
(PRIOR ART)
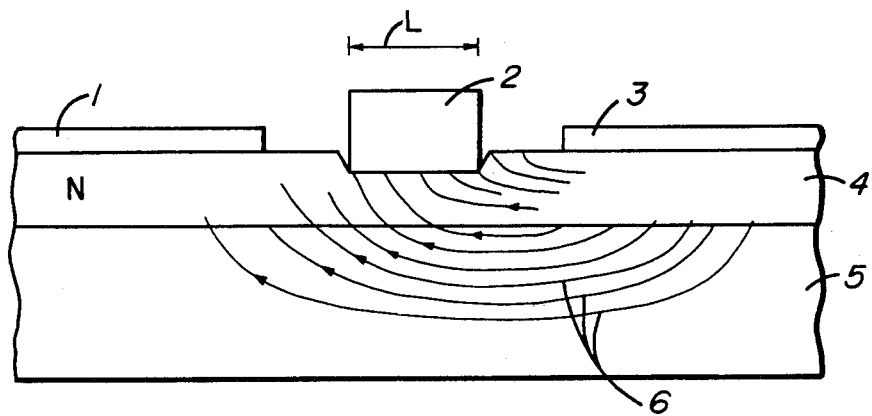
FIG._2

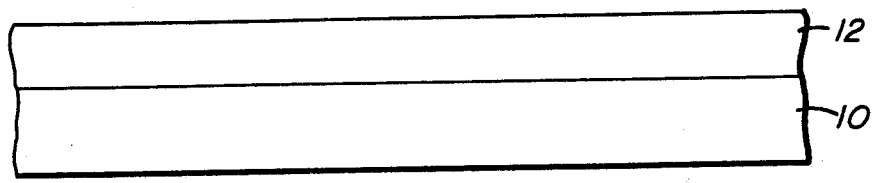
FIG._3a
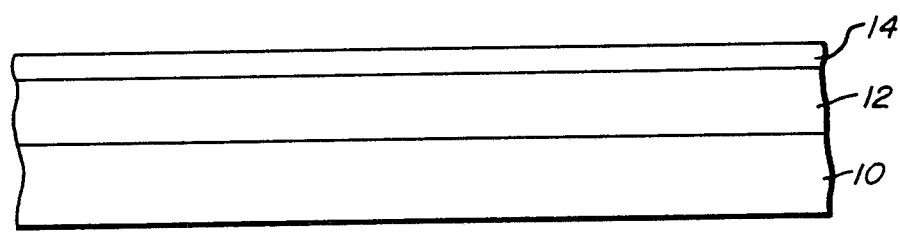
FIG._3b
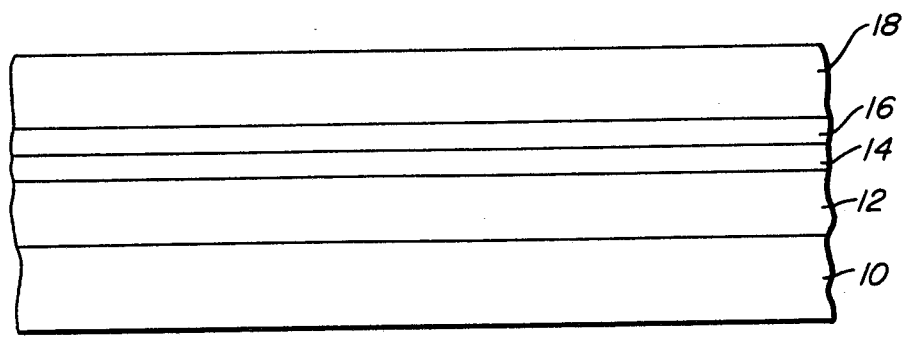
FIG._3c

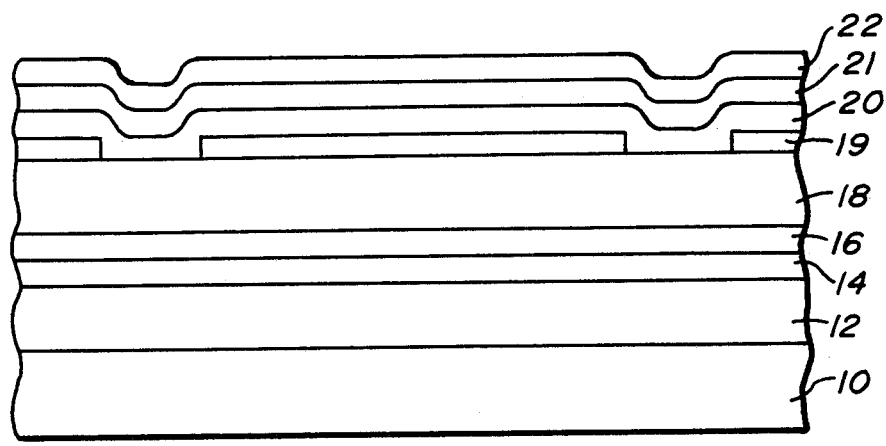
FIG._3d
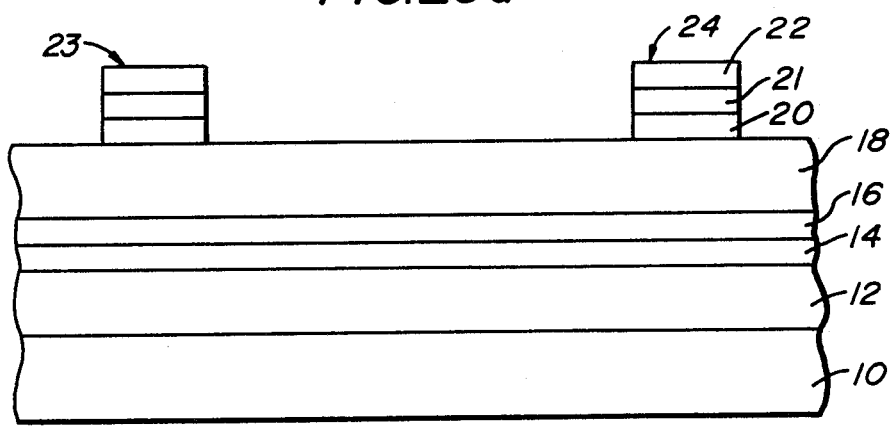
FIG._3e
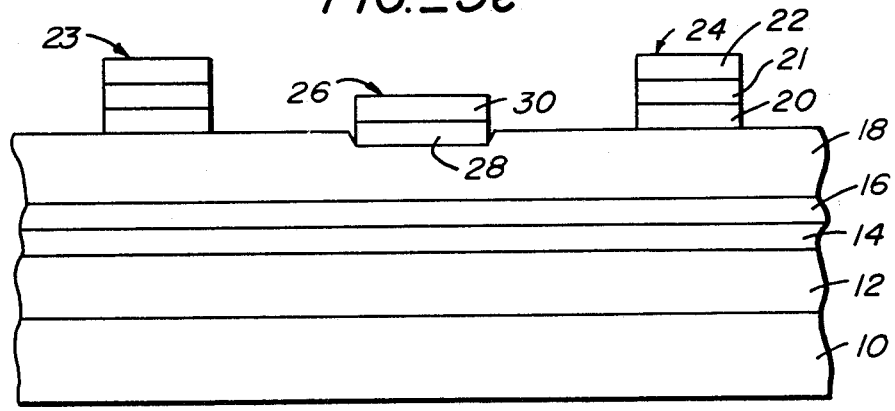
FIG._3f

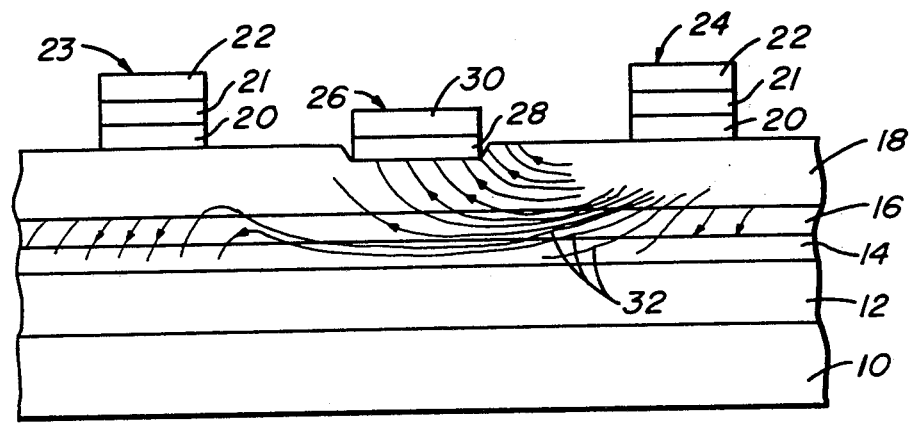
FIG._4
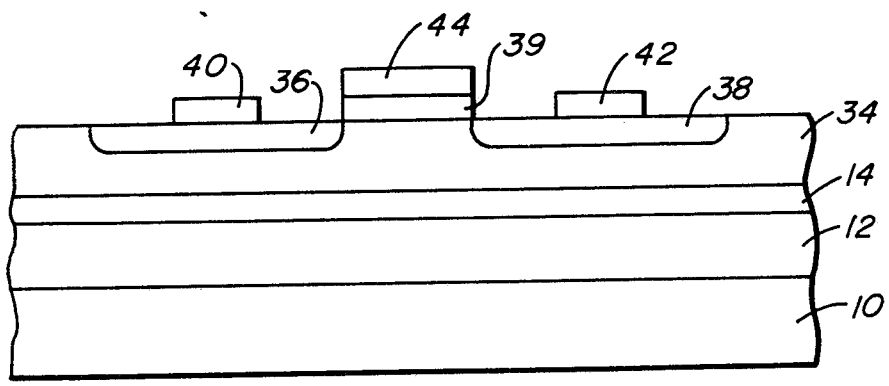
FIG._5

SUBCHANNEL DOPING TO REDUCE SHORT-GATE EFFECTS IN FIELD EFFECT TRANSISTORS

BACKGROUND OF THE INVENTION

This invention relates to a method and structure for reducing short-gate effects in field effect transistors.

FIG. 1 illustrates in cross section a conventional Schottky FET constructed from gallium arsenide. Referring to FIG. 1, the Schottky FET includes an ohmic metal source contact 1, a metal Schottky gate 2, and an ohmic metal drain contact 3 formed on an N type gallium arsenide channel layer 4. Channel layer 4 is formed on a semi-insulating gallium arsenide substrate 5. Portions of channel layer 4 underneath ohmic source contact 1, gate 2, and ohmic drain contact 3 serve as the transistor source, channel, and drain, respectively. Conductivity of the Schottky FET channel between the source and drain is modulated by controlling the size of the depletion region between Schottky gate 2 and channel layer 4.

Unfortunately, during operation, the electric field in the Schottky transistor of FIG. 1 tends to route current carriers through paths deep into substrate 5. FIG. 2 illustrates the Schottky transistor of FIG. 1 including field lines 6. The current carriers (electrons) of the Schottky transistor follow the lines of (but flow in a direction opposite to) electric field lines 6 which extend deep into substrate 5 and far from gate 2. Because of this, a significant portion of the current flowing between the source and drain of the Schottky transistor is not strongly influenced by the electrical potential at gate 2. This results in lowet transconductance, especially as the transistor approaches pinch-off. This also results in higher source to drain conductance for the transistor than would be achieved if electron flow were confined to an area close to gate 2. These effects are particularly severe when the gate length L is very short. Thus, the above-described effects are commonly known as short-gate effects.

One method for mitigating short-gate effects is described by Tohru Takada, et al., in "A Two Gb/s Throughput GaAs Digital Time Switch LSI Using LSCFL" published at the IEEE 1985 Microwave and Millimeter Wave Monolithic Circuits Symposium at St. Louis, Mo. on June 3, 1985. Takada forms a P type region underneath an N type transistor channel using ion implantation. Unfortunately, the Takada process has a number of drawbacks. For example, the amount of P type dopant which may be implanted underneath the Takada channel is extremely limited because if too much P type dopant is implanted into the Takada transistor, the N type region under the Takada gate may be excessively counter doped. Further, the P type layer underneath the Takada channel cannot be formed to an extremely shallow depth (e.g., 100 to 1000 Å) with good control. Also because Takada uses ion implantation, impurities are lodged in the transistor channel region, which causes scattering effects and reduces electron velocity, thereby reducing transconductance.

SUMMARY

A transistor constructed in accordance with our invention includes a channel of a first conductivity type and a semiconductor region of a second conductivity type undernath the channel which mitigates the above-mentioned short channel effects. The semiconductor region of the second conductivity type is formed using a process which avoids the problems caused by the above-mentioned Takada ion implantation process.

A process in accordance with one embodiment of our invention begins with the step of forming the above-mentioned semiconductor region of the second conductivity type on an undoped semiconductor buffer layer. In one embodiment, the undoped buffer layer comprises an epitaxial gallium arsenide layer formed on a gallium arsenide substrate. Thereafter, a second semiconductor layer is grown on the semiconductor region and a third semiconductor layer is grown on the second semiconductor layer. The second semiconductor layer is typically an undoped buffer layer of material such as gallium arsenide and the third semiconductor layer is typically doped gallium arsenide of the first conductivity type. An ohmic source contact, an ohmic drain contact and a Schottky gate are then formed on the third semiconductor layer. The third semiconductor layer serves as the transistor source, channel, and drain. Of importance, the second semiconductor layer is relatively impurity free, thereby minimizing the impurity concentration at the bottom of the channel and scattering effects caused by such impurities. By minimizing the scattering effects, electron velocity in the transistor channel is enhanced.

The semiconductor region of the second conductivity type limits the above-mentioned short channel effects by limiting current flow far from the gate. Further, the semiconductor region is formed without having to implant ions through the third semiconductor layer. Because of this, the semiconductor region can be doped without danger of counterdoping the third semiconductor layer. In addition, the depth of the semiconductor region below the third semiconductor layer can be accurately controlled. These and other advantages of the present invention are described in greater detail below.

BRIEF DESCRIPTION OF THE DRAWINGS

FIG. 1 illustrates in cross section a prior art Schottky gate transistor.

FIG. 2 illustrates electric fields generated in the transistor of FIG. 1 during operation.

FIGS. 3a to 3f illustrate in cross section a transistor constructed during a manufacturing process in accordance with our invention.

FIG. 4 illustrates electric field lines in the transistor of FIG. 3f during operation.

FIG. 5 illustrates an inversion mode Schottky gate transistor constructed in accordance with our invention.

DETAILED DESCRIPTION

A process in accordance with our invention begins with the step of forming a first epitaxial layer 12 on a semiconductor substrate 10 (FIG. 3a). In one embodiment, semiconductor substrate 10 is semi-insulating gallium arsenide (Although the discussion below describes a process in accordance with our invention for forming a gallium arsenide transistor, other semiconductor materials such as silicon can also be used.) Epitaxial layer 12 is formed with a vapor phase epitaxy process which uses arsine and liquid gallium as the reactant sources to grow epitaxial layer 12. Epitaxial layer 12 is typically between 0.5 and 150 microns thick. Preferably, epitaxial layer 12 is between 3 and 5 microns thick. Epitaxial layer 12 is grown at a rate between 0.1 and 0.5 microns/minute, and the growth temperature is typically between 600 and 750° C. Preferably, the growth rate is approximately 3 microns/minute and the growth temperature is between about 725 and 730° C.

Referring to FIG. 3b, a P doped region 14 is formed in first epitaxial layer 12. In one embodiment, region 14 is formed by implanting ions such as beryllium into epitaxial layer 12 at a nonchanneling angle. (A nonchanneling angle is an angle that is not parallel to any of the semiconductor crystal axes. Ions implanted at a nonchanneling angle are thus not permitted to pass through large distances within the semiconductor lattice, but instead lodge in the lattice in accordance with a known distribution.) The implant dosage is typically between $3 \times 10^{11}$ and $5 \times 10^{12}/cm^2$ and the implant energy is between 10 and 400 KEV. Preferably, the dosage is about $6 \times 10^{11}/cm^2$ and the implant energy is about 50 KEV. As will become apparent in light of the discussion below, P doped region 14 prevents electrons from a subsequently formed channel region from flowing far from a subsequently formed transistor gate.

Referring to FIG. 3c, the surface of region 14 is then cleaned and a second epitaxial layer 16 is grown on first epitaxial layer 12 to a thickness between 0 and 1 micron. Preferably, epitaxial layer 16 is 0.1 microns thick. Epitaxial layer 16 serves as a buffer region between a subsequently formed N type epitaxial layer and P doped region 14. Although not essential to the invention, epitaxial layer 16 is highly desirable, and minimizes the impurity concentration at the bottom of the transistor channel.

Thereafter, an N type epitaxial layer 18 is grown on epitaxial layer 16. Epitaxial layer 18 is typically between 0.02 and 2 microns thick. Preferably, epitaxial layer 18 is between about 0.2 and 0.5 microns thick. The growth rate for epitaxial layers 16 and 18 is typically between 10 and 10,000 Å/minute and the growth temperature is between 600 and 750° C. Preferably, the growth rate is between approximately 300 and 500 Å/minute and the growth temperature is between 725 and 730° C. The dopant in N type epitaxial layer 18 is typically sulfur, silicon, or tellurium. Layer 18 has a dopant concentration sufficient to provide a carrier concentration between $1 \times 10^{17}/cc$ and $5 \times 10^{18}/cc$.

Thereafter, the surface of epitaxial layer 18 is chemically etched to achieve a sheet conductivity between 1.6 and 5.0 millimhos. (As is known in the art, the sheet resistance of a layer depends in part on its thickness. Thus, by thinning N type epitaxial layer 18, the sheet resistance of layer 18 is raised to a desired value.)

Referring to FIG. 3d, ohmic source and drain contacts are then formed on epitaxial layer 18. In one embodiment, this is done by covering epitaxial layer 18 with a photoresist layer 19 and patterning the photoresist layer to expose the portions of layer 18 where source and drain contacts are to be formed. Then, photoresist layer 19 and the exposed portions of epitaxial layer 18 are covered with a layer 20 of gold-germanium alloy, a nickel layer 21, and a gold layer 22, in that order, e.g., by sputtering or evaporation. The remaining portions of photoresist layer 19 are then removed along with the metal lying thereon, thereby leaving metal source and drain contacts 23 and 24 (FIG. 3e). Thus, metal contacts 23 and 24 each comprise a gold-germanium layer, a nickel layer, and a gold layer. The wafer is then heated to about 450° C. for approximately 30 seconds, which causes part of the gold-germanium layer within contacts 23 and 24 to alloy with and ohmically contact N type epitaxial layer 18.

Then, the portion of epitaxial layer 18 where a gate is to be formed is then etched using a conventional technique. This is done by covering the wafer with a second photoresist layer (not shown), patterning the photoresist to expose the part of epitaxial layer 18 where gate 26 (FIG. 3f) is to be formed, and etching a portion of the exposed part of epitaxial layer 18 in a conventional manner. In one embodiment, the exposed portion of epitaxial layer 18 is etched with a solution of water, $H_2O_2$, and $NH_4OH$. Thereafter, metal gate 26 is formed, e.g., by sputtering a refractory metal such as a titanium tungsten alloy onto the wafer and a gold layer onto the titanium tungsten layer. The remaining photoresist is then removed from the wafer in a conventional manner along with the metal deposited thereon, thereby leaving gate 26, which includes a titanium-tungsten layer 28 and a gold layer 30.

Although in the above embodiment contacts 23 and 24 are formed before gate 26, in other embodiments gate 26 is formed before contacts 23 and 24. In addition, contacts 23 and 24 and gate 26 can be patterned using processes other than the above-described lift process. For example, contacts 23 and 24 can be patterned by covering N type epitaxial layer 18 with metal and then selectively etching away undesired portions of the metal.

FIG. 4 illustrates the structure of FIG. 3f including lines 32 indicating the direction of the electrical field. As can be seen, the presence of P doped region 14 modifies the shape of the electrical field lines and ensures that electrons do not flow far from gate 26. Because of this, the above-mentioned short channel effects are mitigated.

The reason P doped region 14 modifies the shape of electrical field lines 32 is that holes from region 14 tend to recombine with electrons from epitaxial layer 18, thereby forming a negatively charged space charge region which tends to repel electrons. P doped region 14 is typically very thin so that the above-mentioned recombination renders layer 14 nonconductive. This is done to avoid capacitance between epitaxial layer 18 and P doped region 14, and thereby avoid capacitive coupling between the transistor source and drain. However, in embodiments in which such capacitance is not a concern, P doped region 14 can be arbitrarily thick.

In an alternative embodiment of our invention, instead of forming P doped region 14 by doping part of epitaxial layer 12 using an ion implantation process, P doped region 14 is epitaxially grown on epitaxial layer 12. In this alternative embodiment, the dopant used is carbon, magnesium, beryllium, zinc, or cadmium. P doped region 14 has a thickness less than about 1 micron, and is preferably less than 0.2 microns. Preferably, P doped region 14 is made as thin as possible. The P type dopant concentration in this alternative embodiment depends upon the thickness of region 14 but should be such that the product of the dopant concentration times the thickness of region 14 exceeds $1 \times 10^{11}/cm^2$.

The thickness of layer 16 in this embodiment should be less than 0.5 microns and preferably between about 100 Å and 1000 Å. N doped layer 18 can be any channel layer usable for making field effect transistors. In this alternative embodiment, the various epitaxial layers can be grown on substrate 10 in a continuous fashion. In such an embodiment, selected dopants are introduced at selected times during the epitaxial growth process, and growth conditions such as temperature are modified at selected times so that layers 12, 14, 16, and 18 are formed having desired characters.

In another embodiment of our invention, N doped layer 18 is replaced by multilayer channel structures, e.g. a heterostructure such as a HEMT. (As is known in the art, a heterostructure is a Schottky FET in which the channel region includes a plurality of layers of different semiconductor materials. A HEMT is a heterostructure FET in which electrons are donated by donors in a high band gap material. The donated electrons flow through adjacent undoped low band gap material to maximize carrier mobility through the transistor channel.)

The transistor of FIG. 3f is a depletion mode transistor. FIG. 5 illustrates an inversion mode transistor constructed in accordance with another embodiment of our invention. Referring to FIG. 5, instead of forming layers 16 and 18 on top of region 14, a layer 34 is formed on region 14. Layer 34 is undoped or lightly doped with P type impurities. N type source and drain regions 36 and 38 are formed in layer 34, e.g. by ion implantation, and ohmic metal contacts 40 and 42 are formed on regions 36 and 38, respectively. A layer 39 is formed on a portion of layer 34 and a gate 44 is then formed on layer 39. Layer 39 is typically epitaxially grown high band-gap material or an insulator, and electrically insulates gate 44 from the underlying semiconductor material. Electrical conduction between regions 36 and 38 is modulated by the electrical potential of gate 44. Region 14 tends to confine current carriers near gate 44 as in the previous embodiment.

While the invention has been described with reference to a specific embodiment, those skilled in the art will recognize in light of the present specification that changes can be made in form and detail without departing from the spirit and scope of the invention. For example, as mentioned above, semiconductor materials other than gallium arsenide can be used, e.g. silicon, InP, GaInAs, GaInP, AlGaAs, GaAsP, GaInAsP, etc. In addition, the process of the present invention can be used to manufacture devices other than Schottky FETs, e.g., JFETs and MOSFETs. Also, the process of the present invention can be used to form both P channel and N channel transistors. The process of the present invention can also be used to form enhancement mode and depletion mode transistors. Accordingly, all such changes come within the present invention.

We claim:

1. A method for manufacturing a transistor comprising the steps of:
   providing a first region of semiconductor material of a first conductivity type;
   depositing a second semiconductor region of a second conductivity type on said first region after said step of providing said first region; and
   forming a gate on said second semiconductor region, a first portion of said second semiconductor region serving as a source of said transistor, a second portion of said second semiconductor region serving as a drain of said transistor, wherein the presence of said first region limits the distance from said gate that current carriers flow when traveling between said source and said drain.

2. The process of claim 1 further comprising the step of forming a buffer region between said first region and said second semiconductor region, said buffer region comprising substantially undoped semiconductor material.

3. The method of claim 1 wherein said second semiconductor region is formed with an epitaxial growth process.

4. The method of claim 1 wherein said first region is formed on a semiconductor substrate.

5. The method of claim 1 wherein said first region is doped with an ion implantation process.

6. The method of claim 1 wherein said first region is epitaxially grown on a substrate and doped during epitaxial growth.

7. The method of claim 1 wherein said first region is less than about one micron thick so that said first region is rendered non-conductive in response to current carriers of said second conductivity type from said second semiconductor region recombining with current carriers of said first conductivity type within said first region, in order to substantially eliminate capacitance between said first region and said second semiconductor region.

8. The method of claim 2 wherein said buffer region is between about 100 and 5,000 Å thick.

9. The method of claim 7 wherein the product of dopant concentration in said first region and said thickness of said first region exceeds abuot $1 \times 10^{11}/cm^2$.

10. A method for manufacturing a transistor, said transistor comprising a source and drain, said method comprising the steps of:
    providing a first region of semiconductor material of a first conductivity type;
    depositing a second semiconductor region on said first region after said step of providing said first region; and
    forming a gate on said second semiconductor region, at least a portion of said second semiconductor region serving as a channel, wherein the presence of said first region limits the distance from said gate that current carriers flow when traveling between said source and said drain past said gate.

11. The method of claim 4 further comprising the step of forming a substantially undoped layer on said substrate, said first region of semiconductor material being formed on said substantially undoped layer.

12. The method of claim 10 further comprising the step of forming an insulating layer between said gate and said second semiconductor region.

* * * * *